(12) United States Patent
Chen

(10) Patent No.: US 9,325,310 B2
(45) Date of Patent: Apr. 26, 2016

(54) HIGH-SWING VOLTAGE MODE DRIVER

(71) Applicant: Taiwan Semiconductor Manufacturing Company Limited, Hsin-Chu (TW)

(72) Inventor: Wei Chih Chen, Hsinchu (TW)

(73) Assignee: TAIWAN SEMICONDUCTOR MANUFACTURING COMPANY LIMITED, Hsin-Chu (TW)

(*) Notice: Subject to any disclaimer, the term of this patent is extended or adjusted under 35 U.S.C. 154(b) by 12 days.

(21) Appl. No.: 14/181,822

(22) Filed: Feb. 17, 2014

(65) Prior Publication Data

US 2015/0236690 A1  Aug. 20, 2015

(51) Int. Cl.

| H03K 3/356 | (2006.01) |
| H03K 3/00 | (2006.01) |
| H03K 17/687 | (2006.01) |
| H03M 9/00 | (2006.01) |
| H03K 19/0185 | (2006.01) |
| H03K 17/10 | (2006.01) |

(52) U.S. Cl.
CPC ........ H03K 17/687 (2013.01); H03K 3/356113 (2013.01); H03K 3/356156 (2013.01); H03K 3/356173 (2013.01); H03K 17/102 (2013.01); H03K 19/018528 (2013.01); H03M 9/00 (2013.01)

(58) Field of Classification Search
CPC ................ H03K 19/00315; H03K 19/018521; H03K 3/356113; H03K 19/0013; H03K 19/018528; H03K 17/102; H03K 17/145; H03K 19/00361; H03K 19/0948; H03K 3/356104; H03K 3/35613; H03K 3/356165
See application file for complete search history.

(56) References Cited

U.S. PATENT DOCUMENTS

| 5,192,878 | A | * | 3/1993 | Miyamoto et al. ............... 327/77 |
| 6,232,794 | B1 | * | 5/2001 | Cox ................................. 326/81 |
| 6,650,168 | B1 | * | 11/2003 | Wang et al. ..................... 327/333 |
| 6,940,332 | B2 | * | 9/2005 | Yamahira et al. .............. 327/333 |
| 7,193,443 | B1 | * | 3/2007 | Smith et al. ...................... 326/83 |
| 7,199,617 | B1 | * | 4/2007 | Schrom et al. .................. 326/86 |
| 7,446,566 | B1 | * | 11/2008 | Chrudimsky .......... H03K 3/012 326/68 |
| 8,415,986 | B2 | * | 4/2013 | Seth et al. ...................... 327/108 |
| 8,520,348 | B2 | * | 8/2013 | Dong .............................. 361/56 |
| 2011/0063012 | A1 | * | 3/2011 | Chan ................ H03K 3/356113 327/333 |

* cited by examiner

*Primary Examiner* — Vibol Tan
(74) *Attorney, Agent, or Firm* — Cooper Legal Group, LLC

(57) ABSTRACT

A high-swing voltage mode driver is provided that is operably coupled to a Serializer/Deserializer (SerDes) chip. The high-swing voltage mode driver can operate at a speed of 16 gigabits per second. The high-swing voltage mode driver comprises a thirteenth transistor that is configured to stabilize a voltage at a fifth node, where an output signal that is a negative differential signal exists. The high-swing voltage mode driver comprises a sixteenth transistor that is configured to stabilize a voltage at a sixth node, where an output signal that is a positive differential signal exists.

20 Claims, 6 Drawing Sheets

HIGH-SWING VOLTAGE MODE DRIVER

BACKGROUND

A Serializer/Deserializer (SerDes) chip is configured to at least one of convert serial data to parallel data or convert parallel data to serial data.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
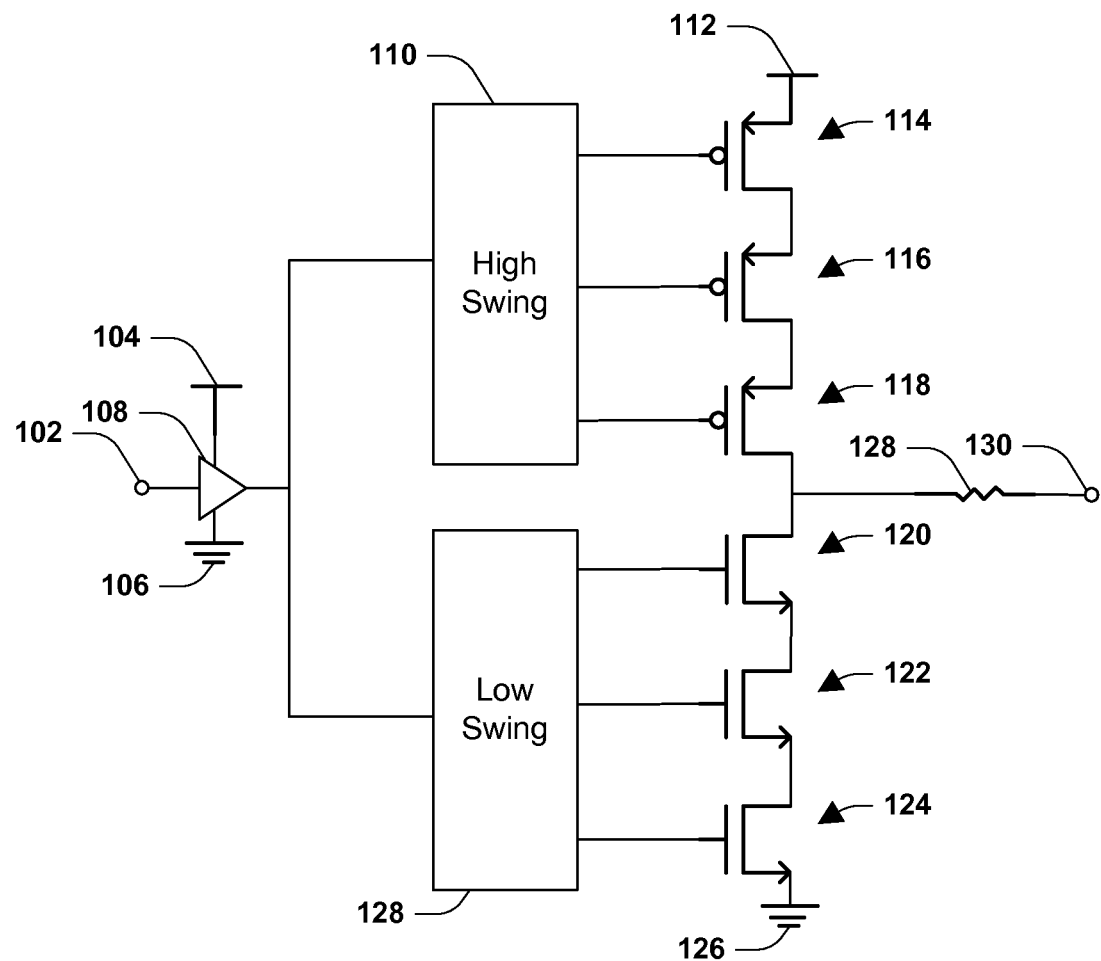
FIG. 1 is an illustration of a circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a Serializer/Deserializer (SerDes) chip is provided. FIG. 1 illustrates a portion of the SerDes chip. In some embodiments, the portion of the SerDes chip comprises a first node 102, a second node 130, an operational amplifier 108, a fourth circuit 110, a fifth circuit 128, a first transistor 114, a second transistor 116, a third transistor 118, a fourth transistor 120, a fifth transistor 122, a sixth transistor 124, a first voltage source 104, a second voltage source 106, a third voltage source 112, a fourth voltage source 126 and a resistor 128. In some embodiments, the first voltage source 104 provides a voltage that is equal to a core voltage. In some embodiments, the core voltage is equal to a voltage that is provided by a power supply for a processor that is operably coupled to the SerDes chip. In some embodiments the second voltage source 106 is ground. In some embodiments, the third voltage source 112 provides a voltage that is substantially equal to 1 volt. In some embodiments, the fourth voltage source 126 is ground. In some embodiments, an input signal exists at the first node 102. In some embodiments, the second node 130 is connected to a pad. In some embodiments, an output signal exists at the pad. In some embodiments, the resistor 128 is a termination resistor. In some embodiments, the resistor 128 has a resistance that is substantially equal to 50 ohms. In some embodiments, the first transistor 114 is a p-channel metal-oxide-semiconductor (PMOS) transistor. In some embodiments, the second transistor 116 is a PMOS transistor. In some embodiments, the third transistor 118 is a PMOS transistor. In some embodiments, the fourth transistor 120 is an n-channel metal-oxide-semiconductor (NMOS) transistor. In some embodiments, the fifth transistor 122 is an NMOS transistor. In some embodiments, the sixth transistor 124 is an NMOS transistor.

In some embodiments, the first node 102 is connected to an input of the operational amplifier 108. In some embodiments, the first voltage source 104 is connected to the operational amplifier 108. In some embodiments, the second voltage source 106 is connected to the operational amplifier 108. In some embodiments, an output of the operational amplifier 108 is connected to the fourth circuit 110. In some embodiments, the output of the operational amplifier 108 is connected to the fifth circuit 128. In some embodiments, the fourth circuit 110 is connected to a gate of the first transistor 114. In some embodiments, the fourth circuit 110 is connected to a gate of the second transistor 116. In some embodiments, the fourth circuit 110 is connected to a gate of the third transistor 118. In some embodiments, the fifth circuit 128 is connected to a gate of the fourth transistor 120. In some embodiments, the fifth circuit 128 is connected to a gate of the fifth transistor 122. In some embodiments, the fifth circuit 128 is connected to a gate of the sixth transistor 124. In some embodiments, the third voltage source 112 is connected to a source of the first transistor 114. In some embodiments, a drain of the first transistor 114 is connected to a source of the second transistor 116. In some embodiments, a drain of the second transistor 116 is connected to a source of the third transistor 118. In some embodiments, a drain of the third transistor 118 is connected to a first side of the resistor 128. In some embodiments, the second node 130 is connected to a second side of the resistor 128. In some embodiments, the first side of the resistor 128 is connected to a drain of the fourth transistor 120. In some embodiments, a source of the fourth transistor 120 is connected to a drain of the fifth transistor 122. In some embodiments, a source of the fifth transistor 122 is connected to a drain of the sixth transistor 124. In some embodiments, a source of the sixth transistor 124 is connected to the fourth voltage source 126.

In some embodiments, the fourth circuit 110 comprises a high-swing voltage mode driver. In some embodiments, the fourth circuit 110 comprises more than one high-swing voltage mode driver. In some embodiments, the fourth circuit 110 comprises a first high-swing voltage mode driver and a second high-swing voltage mode driver. In some embodiments, the first high-swing voltage mode driver controls a voltage at the gate of the first transistor 114. In some embodiments, the voltage at the gate of the first transistor 114 switches between a first voltage and a second voltage. In some embodiments, the first voltage is substantially equal to 1 volt subtracted from the core voltage. In some embodiments, the core voltage is substantially equal to 0.75 volts. In some embodiments, the first voltage is substantially equal to 0.25 volts. In some embodiments, the core voltage is substantially equal to 0.6 volts. In some embodiments, the first voltage is substantially equal to 0.4 volts. In some embodiments, the second voltage is substantially equal to 1 volt. In some embodiments, the second high-swing voltage mode driver controls a voltage at the gate of the second transistor 116. In some embodiments, the voltage at the gate of the second transistor 116 switches between the first voltage and the second voltage. In some embodiments, a portion of the fourth circuit 110 controls a voltage at the gate of the third transistor 118. In some embodiments, the voltage at the gate of the third transistor 118 is substantially equal to the first voltage.

In some embodiments, the fifth circuit 128 comprises a low swing voltage mode driver. In some embodiments, the fifth circuit 128 comprises more than one low-swing voltage mode driver. In some embodiments, the fifth circuit 128 comprises a first low-swing voltage mode driver and a second low-swing voltage mode driver. In some embodiments, a portion of the fifth circuit 128 controls a voltage at the gate of the fourth transistor 120. In some embodiments, the voltage at the gate of the fourth transistor 120 is substantially equal to a third voltage. In some embodiments, the third voltage is substantially equal to the core voltage. In some embodiments, the first low-swing voltage mode driver controls a voltage at the gate of the fifth transistor 122. In some embodiments, the voltage at the gate of the fifth transistor 122 switches between the third voltage and a fourth voltage. In some embodiments, the fourth voltage is substantially equal to 0 volts. In some embodiments, the second low-swing voltage mode driver controls a voltage at the gate of the sixth transistor 124. In some embodiments, the voltage at the gate of the sixth transistor 124 switches between the third voltage and the fourth voltage.

Figure 2:
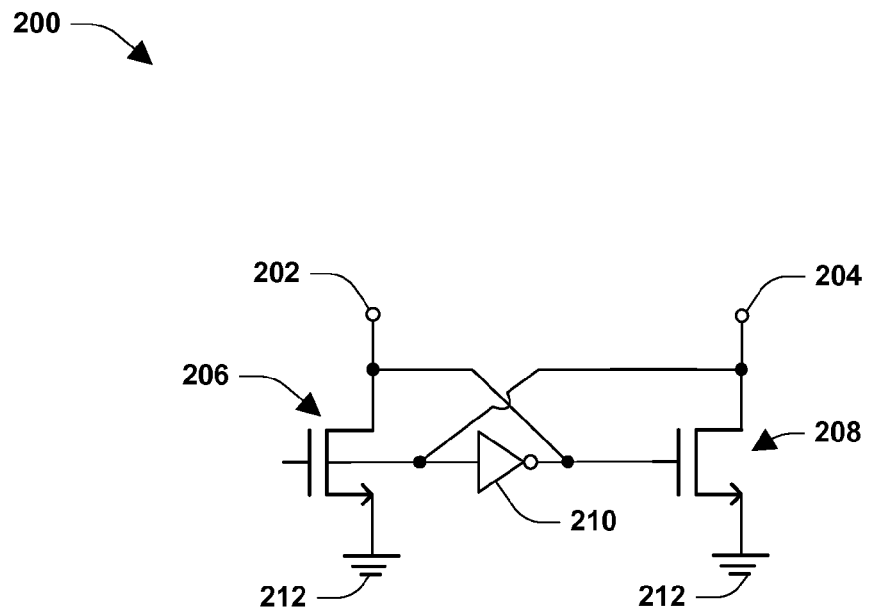
FIG. 2 is an illustration of a circuit, in accordance with some embodiments.

FIG. 2 illustrates a first circuit 200 comprised within the first high-swing voltage mode driver. In some embodiments, the first circuit 200 comprises a third node 202, a fourth node 204, a seventh transistor 206, an eighth transistor 208, an inverter 210 and a fifth voltage source 212. In some embodiments, the seventh transistor 206 is an NMOS transistor. In some embodiments, the eighth transistor 208 is an NMOS transistor. In some embodiments, the fifth voltage source 212 is ground. In some embodiments, the third node 202 is connected to a drain of the seventh transistor 206. In some embodiments, the third node 202 is connected to a gate of the eighth transistor 208. In some embodiments, the third node 202 is connected to an output of the inverter 210. In some embodiments, the fourth node 204 is connected to a drain of the eighth transistor 208. In some embodiments, the fourth node 204 is connected to an input of the inverter 210. In some embodiments, the fourth node 204 is connected to a gate of the seventh transistor 206. In some embodiments, a source of the seventh transistor 206 is connected to the fifth voltage source 212. In some embodiments, a source of the eighth transistor 208 is connected to the fifth voltage source 212.

In some embodiments, a first differential pair comprises a positive input signal and a negative input signal. In some embodiments, the negative input signal exists at the third node 202. In some embodiments, the positive input signal exists at the fourth node 204. In some embodiments, a voltage of the positive input signal switches between a fifth voltage and a sixth voltage. In some embodiments, the fifth voltage is substantially equal to the core voltage. In some embodiments, the sixth voltage is substantially equal to 0 volts. In some embodiments, a voltage of the negative input signal is substantially equal to the fifth voltage when the voltage of the positive input signal is substantially equal to the sixth voltage. In some embodiments, the voltage of the negative input signal is substantially equal to the sixth voltage when the voltage of the positive input signal is substantially equal to the fifth voltage.

In some embodiments, a speed at which the SerDes chip operates is a function of a speed at which a voltage at the third node 202 increases. In some embodiments, the speed at which the SerDes chip operates is a function of a speed at which the voltage at the third node 202 decreases. In some embodiments, the speed at which the voltage at the third node 202 decreases is a function of a number of discharge connections existing at the third node 202. In some embodiments, a discharge connection is a connection to a node having a voltage that is substantially equal to 0 V. In some embodiments, the speed at which the voltage at the third node 202 increases is a function of a number of charge connections at the third node 202. In some embodiments, a charge connection is a connection to a node having a voltage that is substantially equal to the core voltage. In some embodiments, as the number of charge connections at the third node 202 increases, the speed at which the SerDes chip operates increases. In some embodiments, as the number of discharge connections at the third node 202 increases, the speed at which the SerDes chip operates increases. In some embodiments, there is a first charge connection at the third node 202 through the seventh transistor 206. In some embodiments, there is a second charge connection at the third node 202 through the inverter 210. In some embodiments, there is a first discharge connection at the third node 202 through the seventh transistor 206. In some embodiments, there is a second discharge connection at the third node 202 through the inverter 210.

In some embodiments, a speed at which the SerDes chip operates is a function of a speed at which a voltage at the fourth node 204 increases. In some embodiments, the speed at which the SerDes chip operates is a function of a speed at which the voltage at the fourth node 204 decreases. In some embodiments, the speed at which the voltage at the fourth node 204 decreases is a function of a number of discharge connections existing at the fourth node 204. In some embodiments, the speed at which the voltage at the fourth node 204 increases is a function of a number of charge connections at the fourth node 204. In some embodiments, as the number of charge connections at the fourth node 204 increases, the speed at which the SerDes chip operates increases. In some embodiments, as the number of discharge connections at the fourth node 204 increases, the speed at which the SerDes chip operates increases. In some embodiments, there is a third charge connection at the fourth node 204 through the eighth transistor 208. In some embodiments, there is a fourth charge connection at the fourth node 204 through the inverter 210. In some embodiments, there is a third discharge connection at the fourth node 204 through the eighth transistor 208. In some embodiments, there is a fourth discharge connection at the fourth node 204 through the inverter 210.

Figure 3:
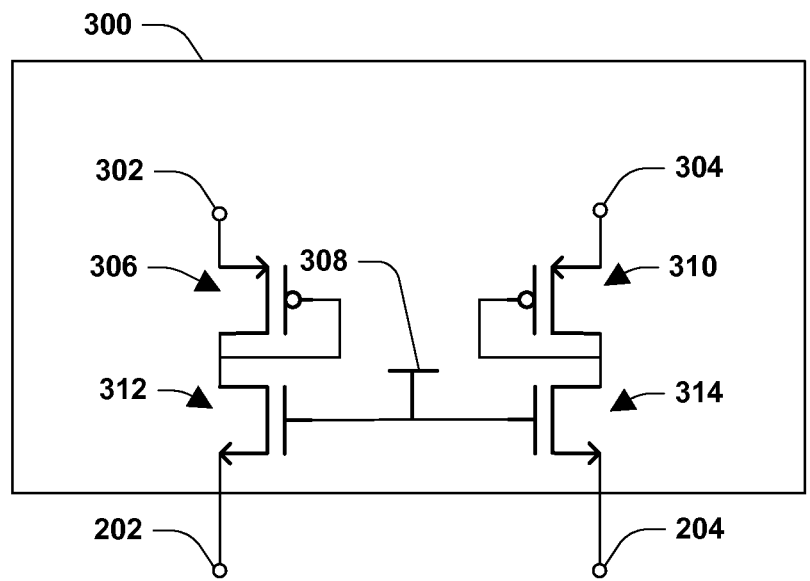
FIG. 3 is an illustration of a circuit, in accordance with some embodiments.

A second circuit 300 that is comprised within the first high-swing voltage mode driver is illustrated in FIG. 3. In some embodiments, the second circuit 300 comprises a fifth node 302, a sixth node 304, a ninth transistor 306, a tenth transistor 310, an eleventh transistor 312, a twelfth transistor 314 and a sixth voltage source 308. In some embodiments, the ninth transistor 306 is a PMOS transistor. In some embodiments, the ninth transistor 306 is a diode-connected transistor. In some embodiments, the tenth transistor 310 is a PMOS transistor. In some embodiments, the tenth transistor 310 is a diode-connected transistor. In some embodiments, the eleventh transistor 312 is an NMOS transistor. In some embodiments, the twelfth transistor 314 is an NMOS transistor. In some embodiments, the sixth voltage source 308 provides a voltage that is substantially equal to the core voltage.

In some embodiments, the fifth node 302 is connected to a source of the ninth transistor 306. In some embodiments, a gate of the ninth transistor 306 is connected to a drain of the ninth transistor 306. In some embodiments, the drain of the ninth transistor 306 is connected to a drain of the eleventh transistor 312. In some embodiments, a gate of the eleventh transistor 312 is connected to the sixth voltage source 308. In some embodiments, a source of the eleventh transistor 312 is connected to the third node 202. In some embodiments, the sixth node 304 is connected to a source of the tenth transistor 310. In some embodiments, a gate of the tenth transistor 310 is connected to a drain of the tenth transistor 310. In some embodiments, the drain of the tenth transistor 310 is connected to a drain of the twelfth transistor 314. In some embodiments, a gate of the twelfth transistor 314 is connected to the sixth voltage source 308. In some embodiments, a source of the twelfth transistor 314 is connected to the fourth node 204.

In some embodiments, a second differential pair comprises a positive output signal and a negative output signal. In some embodiments, the positive output signal exists at the sixth node 304. In some embodiments, the negative output signal exists at the fifth node 302. In some embodiments, a voltage of the positive output signal switches between a seventh voltage and a eighth voltage. In some embodiments, the seventh voltage is substantially equal to 1 volt subtracted by the core voltage. In some embodiments, the seventh voltage is substantially equal to 0.4 volts. In some embodiments, the eighth voltage is substantially equal to 1 volt. In some embodiments, a voltage of the negative output signal is substantially equal to the eighth voltage when the voltage of the positive output signal is substantially equal to the seventh voltage. In some embodiments, the voltage of the negative output signal is substantially equal to the seventh voltage when the voltage of the positive output signal is substantially equal to the eighth voltage.

Figure 4:
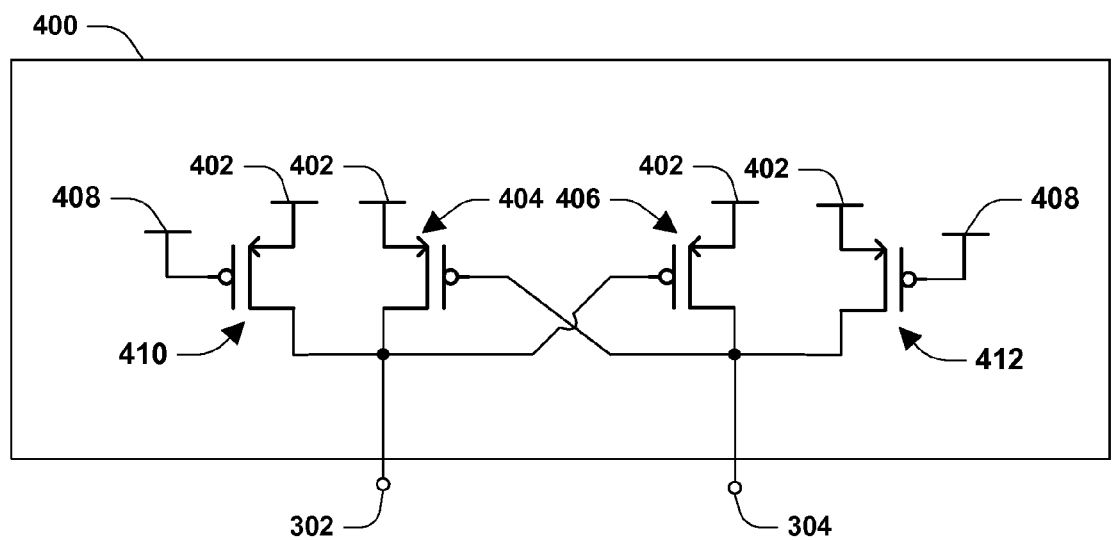
FIG. 4 is an illustration of a circuit, in accordance with some embodiments.

A third circuit 400 that is comprised within the first high-swing voltage mode driver is illustrated in FIG. 4. In some embodiments, the third circuit 400 comprises a seventh voltage source 402, an eighth voltage source 408, a thirteenth transistor 410, a fourteenth transistor 404, a fifteenth transistor 406 and a sixteenth transistor 412. In some embodiments, the seventh voltage source 402 provides a voltage that is substantially equal to 1 volt. In some embodiments, the eighth voltage source 408 provides a voltage that is substantially equal to 1 volt subtracted by the core voltage. In some embodiments, the thirteenth transistor 410 is a PMOS transistor. In some embodiments, the fourteenth transistor 404 is a PMOS transistor. In some embodiments, the fifteenth transistor 406 is a PMOS transistor. In some embodiments, the sixteenth transistor 412 is a PMOS transistor.

In some embodiments, the eighth voltage source 408 is connected to a gate of the thirteenth transistor 410. In some embodiments, the seventh voltage source 402 is connected to a source of the thirteenth transistor 410. In some embodiments, a drain of the thirteenth transistor 410 is connected to a drain of the fourteenth transistor 404. In some embodiments, a source of the fourteenth transistor 404 is connected to the seventh voltage source 402. In some embodiments, a gate of the fourteenth transistor 404 is connected to a drain of the fifteenth transistor 406. In some embodiments, a gate of the fifteenth transistor 406 is connected to the drain of the fourteenth transistor 404. In some embodiments, a source of the fifteenth transistor 406 is connected to the seventh voltage source 402. In some embodiments, the drain of the fifteenth transistor 406 is connected to a drain of the sixteenth transistor 412. In some embodiments, a gate of the sixteenth transistor 412 is connected to the eighth voltage source 408. In some embodiments, a source of the sixteenth transistor 412 is connected to the seventh voltage source 402. In some embodiments, the fifth node 302 is connected to the drain of the fourteenth transistor 404. In some embodiments, the sixth node 304 is connected to the drain of the fifteenth transistor 406.

Figure 5:
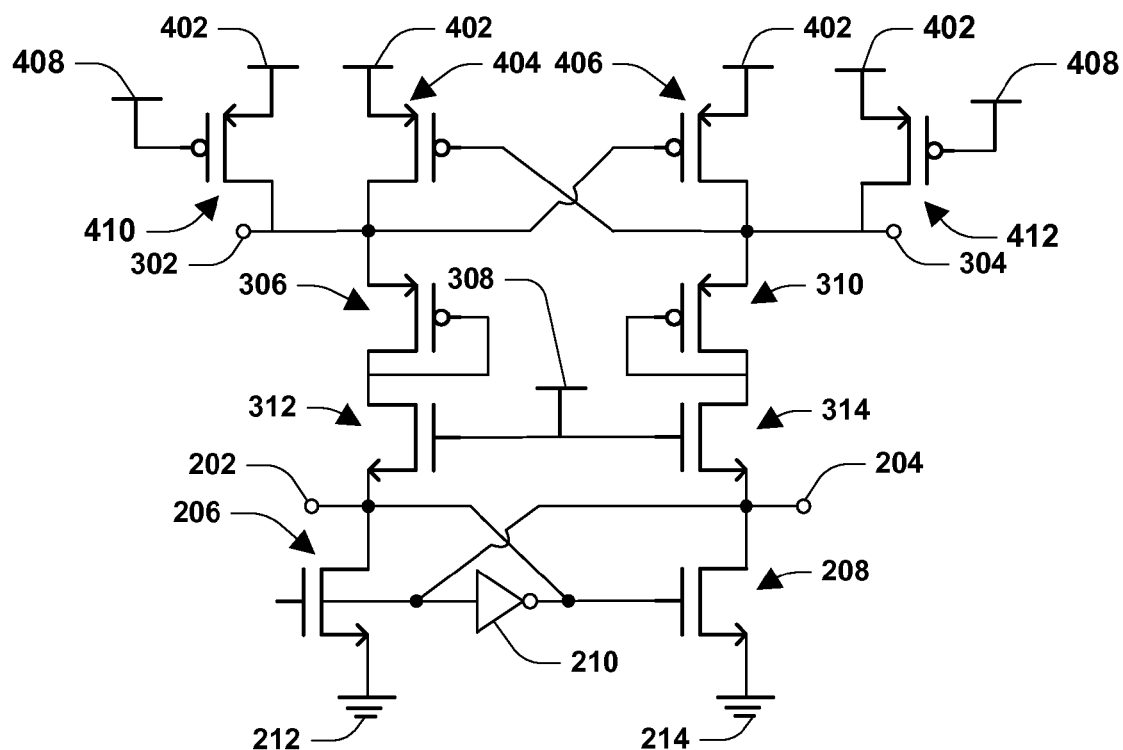
FIG. 5 is an illustration of a circuit, in accordance with some embodiments.

In some embodiments, FIG. 5 illustrates the first high-swing voltage mode driver comprising the first circuit 200, the second circuit 300 and the third circuit 400. In some embodiments, the third node 202 is connected to a drain of the seventh transistor 206. In some embodiments, the third node 202 is connected to a gate of the eighth transistor 208. In some embodiments, the third node 202 is connected to an output of the inverter 210. In some embodiments, the fourth node 204 is connected to a drain of the eighth transistor 208. In some embodiments, the fourth node 204 is connected to an input of the inverter 210. In some embodiments, the fourth node 204 is connected to a gate of the seventh transistor 206. In some embodiments, a source of the seventh transistor 206 is connected to the fifth voltage source 212. In some embodiments, a source of the eighth transistor 208 is connected to the fifth voltage source 212. In some embodiments, the fifth node 302 is connected to a source of the ninth transistor 306. In some embodiments, a gate of the ninth transistor 306 is connected to a drain of the ninth transistor 306. In some embodiments, the drain of the ninth transistor 306 is connected to a drain of the eleventh transistor 312. In some embodiments, a gate of the eleventh transistor 312 is connected to the sixth voltage source 308. In some embodiments, a source of the eleventh transistor 312 is connected to the third node 202. In some embodiments, the sixth node 304 is connected to a source of the tenth transistor 310. In some embodiments, a gate of the tenth transistor 310 is connected to a drain of the tenth transistor 310. In some embodiments, the drain of the tenth transistor 310 is connected to a drain of the twelfth transistor 314. In some embodiments, a gate of the twelfth transistor 314 is connected to the sixth voltage source 308. In some embodiments, a source of the twelfth transistor 314 is connected to the fourth node 204. In some embodiments, the eighth voltage source 408 is connected to a gate of the thirteenth transistor 410. In some embodiments, the seventh voltage source 402 is connected to a source of the thirteenth transistor 410. In some embodiments, a drain of the thirteenth transistor 410 is connected to a drain of the fourteenth transistor 404. In some embodiments, a source of the fourteenth transistor 404 is connected to the seventh voltage source 402. In some embodiments, a gate of the fourteenth transistor 404 is connected to a drain of the fifteenth transistor 406. In some embodiments, a gate of the fifteenth transistor 406 is connected to the drain of the fourteenth transistor 404. In some embodiments, a source of the fifteenth transistor 406 is connected to the seventh voltage source 402. In some embodiments, the drain of the fifteenth transistor 406 is connected to a drain of the sixteenth transistor 412. In some embodiments, a gate of the sixteenth transistor 412 is connected to the eighth voltage source 408. In some embodiments, a source of the sixteenth transistor 412 is connected to the seventh voltage source 402. In some embodiments, the fifth node 302 is connected to the drain of the fourteenth transistor 404. In some embodiments, the sixth node 304 is connected to the drain of the fifteenth transistor 406.

In some embodiments, the sixth node 304 is connected to the gate of the first transistor 114. In some embodiments, the fifth node 302 is connected to the gate of the first transistor 114 if the sixth node 304 is not connected to the gate of the first transistor 114. In some embodiments, the second high-swing voltage mode driver has the same configuration as the first high-swing voltage mode driver. In some embodiments, the second high-swing voltage mode driver is connected to the gate of the second transistor 116.

In some embodiments, the speed at which the SerDes chip operates is a function of a propagation delay between the fourth node 204, where the positive input signal exists, and the sixth node 304, where the positive output signal exists. In some embodiments, the propagation delay between the fourth node 204 and the sixth node 304 is a function of a number of devices connected between the fourth node 204 and the sixth node 304. In some embodiments, as the number of devices connected between the fourth node 204 and the sixth node 304 increases, the speed at which the SerDes chip operates decreases. In some embodiments, the tenth transistor 310 and the twelfth transistor 314 are respectively connected between the fourth node 204 and the sixth node 304.

In some embodiments, the speed at which the SerDes chip operates is a function of a propagation delay between the third node 202, where the negative input signal exists, and the fifth node 302, where the negative output signal exists. In some embodiments, the propagation delay between the third node 202 and the fifth node 302 is a function of a number of devices connected between the third node 202 and the fifth node 302. In some embodiments, as the number of devices connected between the third node 202 and the fifth node 302 increases, the speed at which the SerDes chip operates decreases. In some embodiments, the ninth transistor 306 and the eleventh transistor 312 are respectively connected between the third node 202 and the fifth node 302.

In some embodiments, the speed at which the SerDes chip operates is substantially equal to 16 gigabits per second.

In some embodiments, the thirteenth transistor 410 is configured to apply a voltage to the fifth node 302. In some embodiments, the thirteenth transistor 410 is configured to stabilize a voltage at the fifth node 302 when the voltage at the fifth node 302 is not constant. In some embodiments, the sixteenth transistor 412 is configured to apply a voltage at the sixth node 304. In some embodiments, the sixteenth transistor 412 is configured to stabilize a voltage at the sixth node 304 when the voltage at the sixth node 304 is not constant.

In some embodiments, the seventh voltage is substantially equal to a resistance across the thirteenth transistor 410 divided by a sum of the resistance across the thirteenth transistor 410, a resistance across the ninth transistor 306, a resistance across the eleventh transistor 312 and a resistance across the seventh transistor 206.

Figure 6:
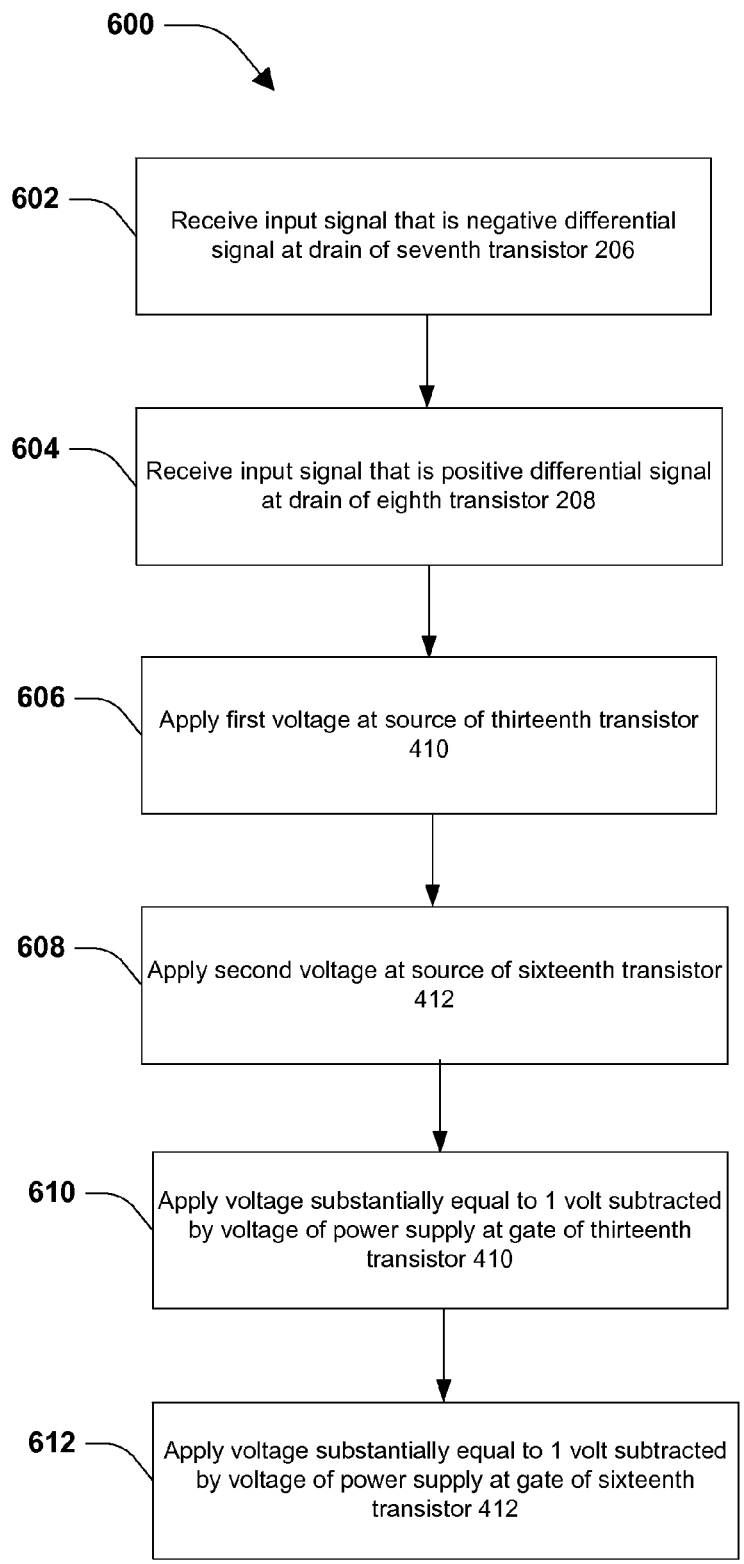
FIG. 6 illustrates a flow diagram of a method, according to some embodiments.

FIG. 6 illustrates a method 600 for operating the SerDes chip using the first high-swing voltage mode driver. At 602, the first high-swing voltage mode driver receives the negative input signal at the third node 202. At 604, the first high-swing voltage mode driver receives the positive input signal at the fourth node 204. At 606, a voltage that is substantially equal to 1 volt is applied at the source of the thirteenth transistor 410 by the seventh voltage source 402. At 608, a voltage that is substantially equal to 1 volt is applied at the source of the sixteenth transistor 412 by the seventh voltage source 402. At 610, a voltage that is substantially equal to 1 volt subtracted by the core voltage is applied at the gate of the thirteenth transistor 410 by the eighth voltage source 408. At 612, a voltage that is substantially equal to 1 volt subtracted by the core voltage is applied at the gate of the sixteenth transistor 412 by the eighth voltage source 408.

In some embodiments, a high-swing voltage mode driver is provided, comprising a first circuit, a second circuit and a third circuit. In some embodiments, the first circuit comprises a seventh transistor, an eighth transistor and an inverter. In some embodiments a drain of the seventh transistor is connected to a first side of the inverter. In some embodiments, a drain of the eighth transistor is connected to a second side of the inverter. In some embodiments, the second circuit comprises a ninth transistor, a tenth transistor, an eleventh transistor and a twelfth transistor. In some embodiments, a drain of the ninth transistor is connected to a drain of the eleventh transistor. In some embodiments, a drain of the tenth transistor is connected to a drain of the twelfth transistor. In some embodiments, the drain of the seventh transistor is connected to a source of the eleventh transistor. In some embodiments, the drain of the eighth transistor is connected to a source of the twelfth transistor. In some embodiments, the third circuit comprises a fourteenth transistor and a fifteenth transistor. In some embodiments, a source of the ninth transistor is connected to a drain of the fourteenth transistor. In some embodiments, a source of the tenth transistor is connected to a drain of the fifteenth transistor.

In some embodiments, a high-swing voltage mode driver is provided, comprising a first circuit, a second circuit and a third circuit. In some embodiments, the first circuit comprises a seventh transistor, an eighth transistor and an inverter. In some embodiments, the second circuit comprises a ninth transistor, a tenth transistor, an eleventh transistor and a twelfth transistor. In some embodiments, a gate of the ninth transistor is connected to a drain of the ninth transistor and a gate of the tenth transistor is connected to a drain of the tenth transistor. In some embodiments, the third circuit comprises a thirteenth transistor, a fourteenth transistor, a fifteenth transistor and a sixteenth transistor. In some embodiments, a source of the thirteenth transistor is connected to an eighth voltage source. In some embodiments, a source of the sixteenth transistor is connected to the eighth voltage source. In some embodiments, the thirteenth transistor is configured to stabilize a voltage at a drain of the thirteenth transistor and the sixteenth transistor is configured to stabilize a voltage at a drain of the sixteenth transistor.

In some embodiments, a method for operating a SerDes chip using a high-swing voltage mode driver is provided. In some embodiments, the method comprises receiving an input signal that is a negative differential signal at a drain of a seventh transistor comprised within the high-swing voltage mode driver. In some embodiments, the method comprises receiving an input signal that is a positive differential signal at a drain of an eighth transistor comprised within the high-swing voltage mode driver. In some embodiments, the method comprises applying a first voltage that is substantially equal to 1 volt at a source of a thirteenth transistor comprised within the high-swing voltage mode driver. In some embodiments, the method comprises applying a second voltage that is substantially equal to 1 volt at a source of a sixteenth transistor comprised within the high-swing voltage mode driver.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A high-swing voltage mode driver, comprising:
   a first circuit comprising a first transistor, a second transistor and an inverter, a drain of the first transistor coupled to a first side of the inverter and a drain of the second transistor coupled to a second side of the inverter;
   a second circuit comprising a third transistor, a fourth transistor, a fifth transistor and a sixth transistor, a drain of the third transistor coupled to a drain of the fifth transistor, a drain of the fourth transistor coupled to a drain of the sixth transistor, the drain of the first transistor coupled to a source of the fifth transistor and the drain of the second transistor coupled to a source of the sixth transistor; and
   a third circuit comprising a seventh transistor and an eighth transistor, a source of the third transistor coupled to a drain of the seventh transistor and a source of the fourth transistor coupled to a drain of the eighth transistor.

2. The high-swing voltage mode driver of claim 1, the first transistor comprising an n-channel metal-oxide-semiconductor (NMOS) transistor.

3. The high-swing voltage mode driver of claim 1, the drain of the second transistor coupled to a node where an input signal that is a positive differential signal exists.

4. The high-swing voltage mode driver of claim 1, the drain of the first transistor coupled to a node where an input signal that is a negative differential signal exists.

5. The high-swing voltage mode driver of claim 1, a source of the first transistor coupled to ground.

6. The high-swing voltage mode driver of claim 1, a source of the second transistor coupled to ground.

7. The high-swing voltage mode driver of claim 1, the third transistor comprising a diode-coupled p-channel metal-oxide-semiconductor (PMOS) transistor.

8. The high-swing voltage mode driver of claim 1, the fourth transistor comprising a diode-coupled PMOS transistor.

9. The high-swing voltage mode driver of claim 1, a gate of the fifth transistor and a gate of the sixth transistor respectively coupled to a first voltage source.

10. The high-swing voltage mode driver of claim 1 manufactured using complementary metal-oxide-semiconductor (CMOS) technology.

11. A high-swing voltage mode driver, comprising:
    a first circuit comprising a first transistor, a second transistor and an inverter;
    a second circuit comprising a third transistor, a fourth transistor, a fifth transistor and a sixth transistor, a gate of the third transistor coupled to a drain of the third transistor and a gate of the fourth transistor coupled to a drain of the fourth transistor; and
    a third circuit comprising a seventh transistor, an eighth transistor, a ninth transistor and a tenth transistor, a source of the seventh transistor coupled to a first voltage source and a source of the tenth transistor coupled to the first voltage source, the seventh transistor configured to stabilize a voltage at a drain of the seventh transistor and the tenth transistor configured to stabilize a voltage at a drain of the tenth transistor.

12. The high-swing voltage mode driver of claim 11, the seventh transistor comprising a p-channel metal-oxide-semiconductor (PMOS) transistor.

13. The high-swing voltage mode driver of claim 11, the tenth transistor comprising a PMOS transistor.

14. The high-swing voltage mode driver of claim 11, a drain of the tenth transistor coupled to a node where an output signal that is a positive differential signal exists and a drain of the seventh transistor coupled to a node where an output signal that is a negative differential signal exists.

15. The high-swing voltage mode driver of claim 11, a drain of the tenth transistor coupled to a drain of the ninth transistor and to a gate of the eighth transistor.

16. The high-swing voltage mode driver of claim 11, a drain of the seventh transistor coupled to a drain of the eighth transistor and to a gate of the ninth transistor.

17. The high-swing voltage mode driver of claim 11, the fifth transistor comprising an n-channel metal-oxide-semiconductor (NMOS) transistor and the sixth transistor comprising an NMOS transistor.

18. The high-swing voltage mode driver of claim 11, comprising a node where an output signal exists that has a voltage that is substantially equal to a resistance across the seventh transistor divided by a sum of the resistance across the seventh transistor, a resistance across the third transistor, a resistance across the fifth transistor and a resistance across the first transistor.

19. A high-swing voltage mode driver, comprising:
an inverter;
a first transistor comprising a gate coupled to a first terminal of the inverter;
a second transistor comprising a gate coupled to a second terminal of the inverter, wherein:
  a drain of the second transistor is coupled to the first terminal of the inverter to form a current path between the first terminal and the drain of the second transistor; and
  a drain of the first transistor is coupled to the second terminal of the inverter to form a current path between the second terminal and the drain of the first transistor;
a third transistor comprising a source coupled to the drain of the first transistor to form a current path between the second terminal and the source of the third transistor; and
a fourth transistor comprising a source coupled to the drain of the second transistor to form a current path between the first terminal and the source of the fourth transistor, wherein a gate of the third transistor and a gate of the fourth transistor are coupled to a first voltage source.

20. The high-swing voltage mode driver of claim 19, wherein:
a source of the first transistor and a source of the second transistor are coupled to a second voltage source.

* * * * *